United States Patent
Takahashi et al.

(10) Patent No.: US 10,991,510 B2
(45) Date of Patent: Apr. 27, 2021

(54) DIELECTRIC MEMBRANE AND DIELECTRIC ELEMENT

(71) Applicant: TDK CORPORATION, Tokyo (JP)

(72) Inventors: Saori Takahashi, Tokyo (JP); Masahito Furukawa, Tokyo (JP); Masamitsu Haemori, Tokyo (JP); Hiroki Uchiyama, Tokyo (JP); Wakiko Sato, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 12 days.

(21) Appl. No.: 16/359,824

(22) Filed: Mar. 20, 2019

(65) Prior Publication Data
US 2019/0304688 A1 Oct. 3, 2019

(30) Foreign Application Priority Data
Mar. 28, 2018 (JP) .............................. JP2018-061459

(51) Int. Cl.
*H01G 4/33* (2006.01)
*H01G 4/12* (2006.01)

(52) U.S. Cl.
CPC .......... *H01G 4/1227* (2013.01); *H01G 4/1236* (2013.01); *H01G 4/33* (2013.01)

(58) Field of Classification Search
CPC ...... H01G 4/1227; H01G 4/33; H01G 4/1236; C04B 2235/787; C04B 2235/768; C04B 35/4682; C04B 35/49; C04B 35/465; H01L 28/55
See application file for complete search history.

(56) References Cited

U.S. PATENT DOCUMENTS

| | | | | |
|---|---|---|---|---|
| 5,739,563 A | * | 4/1998 | Kawakubo | H01L 27/11502 257/295 |
| 2012/0001298 A1 | * | 1/2012 | Sakurai | B82Y 30/00 257/532 |
| 2013/0065065 A1 | | 3/2013 | Nakajima et al. | |
| 2016/0217931 A1 | * | 7/2016 | Saita | H01G 4/1236 |

FOREIGN PATENT DOCUMENTS

| JP | 2004-210601 A | 7/2004 |
|---|---|---|
| JP | 2011-236112 A | 11/2011 |

OTHER PUBLICATIONS

Xu et al. (111)-Oriented BaTiO, Thin Films Hydrothermally Formed on TiO2/Si Substrate.Integrated Ferroelectrics , 1996. vol. 12, pp. 233-239.*

* cited by examiner

*Primary Examiner* — Noah S Wiese
(74) *Attorney, Agent, or Firm* — Oliff PLC

(57) ABSTRACT

A dielectric membrane may be exposed to an acid solution such as hydrochloric acid, nitric acid, or sulfuric acid during a wet process after membrane formation. The inventors have newly found that when a dielectric membrane includes Ca having a lower ionization tendency than Ba and Zr having a lower ionization tendency than Ti in a main component of a metal oxide expressed by a general formula $(Ba, Ca)(Ti, Zr)O_3$ and satisfies at least one of degree of orientation of (100) plane>degree of orientation of (110) plane and degree of orientation of (111) plane>degree of orientation of (110) plane in a membrane thickness direction, the dielectric membrane is less likely to be damaged during a wet process, and the resistance to a wet process is improved.

6 Claims, 7 Drawing Sheets

Fig.2

| | MEMBRANE COMPOSITION $(Ba_{1-x}Ca_x)_z(Ti_{1-y}Zr_y)O_3$ | | | PRODUCTION METHOD |
|---|---|---|---|---|
| | x | y | z | |
| EXAMPLE 1 | 0.300 | 0.300 | 1.010 | SPUTTERING METHOD |
| EXAMPLE 2 | 0.300 | 0.300 | 1.010 | SPUTTERING METHOD |
| EXAMPLE 3 | 0.300 | 0.300 | 1.010 | SPUTTERING METHOD |
| EXAMPLE 4 | 0.300 | 0.300 | 0.900 | SPUTTERING METHOD |
| EXAMPLE 5 | 0.300 | 0.300 | 1.050 | SPUTTERING METHOD |
| EXAMPLE 6 | 0.700 | 0.300 | 1.010 | SPUTTERING METHOD |
| EXAMPLE 7 | 0.300 | 0.700 | 1.010 | SPUTTERING METHOD |
| COMPARATIVE EXAMPLE 1 | 0.300 | – | 1.010 | SPUTTERING METHOD |
| COMPARATIVE EXAMPLE 2 | – | 0.300 | 1.010 | SPUTTERING METHOD |
| COMPARATIVE EXAMPLE 3 | 0.300 | 0.300 | 1.010 | SPUTTERING METHOD |

| | RELATIONSHIP BETWEEN DEGREES OF ORIENTATION | | DAMAGE TO DIELECTRIC MEMBRANE | DETERMINATION |
|---|---|---|---|---|
| | F1>F2 | F3>F2 | | |
| EXAMPLE 1 | ✓ | × | NO DAMAGE | ✓ |
| EXAMPLE 2 | × | ✓ | NO DAMAGE | ✓ |
| EXAMPLE 3 | ✓ | ✓ | NO DAMAGE | ✓ |
| EXAMPLE 4 | ✓ | × | NO DAMAGE | ✓ |
| EXAMPLE 5 | × | ✓ | NO DAMAGE | ✓ |
| EXAMPLE 6 | × | ✓ | NO DAMAGE | ✓ |
| EXAMPLE 7 | ✓ | ✓ | NO DAMAGE | ✓ |
| COMPARATIVE EXAMPLE 1 | ✓ | × | DAMAGED | × |
| COMPARATIVE EXAMPLE 2 | × | ✓ | DAMAGED | × |
| COMPARATIVE EXAMPLE 3 | × | × | DAMAGED | × |

Fig.3

| | MEMBRANE COMPOSITION $(Ba_{1-x}Ca_x)_z(Ti_{1-y}Zr_y)O_3$ | | | PRODUCTION METHOD | RELATIONSHIP BETWEEN DEGREES OF ORIENTATION | |
|---|---|---|---|---|---|---|
| | x | y | z | | F1>F2 | F3>F2 |
| COMPARATIVE EXAMPLE 4 | 0.300 | 0.300 | 0.995 | SPUTTERING METHOD | ✗ | ✓ |
| EXAMPLE 8 | 0.300 | 0.300 | 0.996 | SPUTTERING METHOD | ✓ | ✓ |
| EXAMPLE 9 | 0.300 | 0.300 | 1.039 | SPUTTERING METHOD | ✓ | ✓ |
| COMPARATIVE EXAMPLE 5 | 0.300 | 0.300 | 1.040 | SPUTTERING METHOD | ✓ | ✗ |
| EXAMPLE 10 | 0.001 | 0.300 | 1.010 | SPUTTERING METHOD | ✓ | ✗ |
| EXAMPLE 11 | 0.500 | 0.300 | 1.010 | SPUTTERING METHOD | ✓ | ✓ |
| COMPARATIVE EXAMPLE 6 | 0.550 | 0.300 | 1.010 | SPUTTERING METHOD | ✗ | ✓ |
| EXAMPLE 12 | 0.300 | 0.001 | 1.010 | SPUTTERING METHOD | ✓ | ✓ |
| EXAMPLE 13 | 0.300 | 0.400 | 1.010 | SPUTTERING METHOD | ✓ | ✓ |
| COMPARATIVE EXAMPLE 7 | 0.300 | 0.500 | 1.010 | SPUTTERING METHOD | ✓ | ✓ |

| | RELATIVE DIELECTRIC CONSTANT (—) | RESISTANCE (MΩ) | DAMAGE TO DIELECTRIC MEMBRANE | DETERMINATION |
|---|---|---|---|---|
| COMPARATIVE EXAMPLE 4 | 934 | 137 | NO DAMAGE | ✗ |
| EXAMPLE 8 | 1065 | 4430 | NO DAMAGE | ✓ |
| EXAMPLE 9 | 1681 | 2374 | NO DAMAGE | ✓ |
| COMPARATIVE EXAMPLE 5 | 1382 | 8 | NO DAMAGE | ✗ |
| EXAMPLE 10 | 1588 | 2038 | NO DAMAGE | ✓ |
| EXAMPLE 11 | 1511 | 1988 | NO DAMAGE | ✓ |
| COMPARATIVE EXAMPLE 6 | 922 | 1867 | NO DAMAGE | ✗ |
| EXAMPLE 12 | 1672 | 1002 | NO DAMAGE | ✓ |
| EXAMPLE 13 | 1498 | 1877 | NO DAMAGE | ✓ |
| COMPARATIVE EXAMPLE 7 | 876 | 1798 | NO DAMAGE | ✗ |

Fig.4

| | MEMBRANE COMPOSITION $(Ba_{1-x}Ca_x)_z(Ti_{1-y}Zr_y)O_3$ | | | PRODUCTION METHOD | RELATIONSHIP BETWEEN DEGREES OF ORIENTATION | | RELATIONSHIP BETWEEN INTEGRATED INTENSITIES | RELATIVE DIELECTRIC CONSTANT (—) |
|---|---|---|---|---|---|---|---|---|
| | x | y | z | | F1>F2 | F3>F2 | (111)>(110) | |
| EXAMPLE 14 | 0.300 | 0.300 | 1.010 | SPUTTERING METHOD | ✓ | ✓ | ✓ | 2233 |
| EXAMPLE 15 | 0.300 | 0.300 | 1.010 | SPUTTERING METHOD | × | ✓ | ✓ | 2018 |
| EXAMPLE 16 | 0.300 | 0.300 | 1.010 | SPUTTERING METHOD | ✓ | ✓ | × | 1613 |
| EXAMPLE 17 | 0.300 | 0.300 | 1.010 | SPUTTERING METHOD | ✓ | × | × | 1566 |

| | RESISTANCE (MΩ) | DAMAGE TO DIELECTRIC MEMBRANE | DETERMINATION |
|---|---|---|---|
| EXAMPLE 14 | 6716 | NO DAMAGE | ✓+ |
| EXAMPLE 15 | 4288 | NO DAMAGE | ✓+ |
| EXAMPLE 16 | 3832 | NO DAMAGE | ✓ |
| EXAMPLE 17 | 3288 | NO DAMAGE | ✓ |

Fig.5

| | MEMBRANE COMPOSITION $(Ba_{1-x}Ca_x)_z(Ti_{1-y}Zr_y)O_3$ | | | ACCESSORY COMPONENT | WITH RESPECT TO 100 mol OF MAIN COMPONENT (mol) | PRODUCTION METHOD |
|---|---|---|---|---|---|---|
| | x | y | z | | | |
| EXAMPLE 18 | 0.300 | 0.300 | 1.010 | MnO | 0.30 | SPUTTERING METHOD |
| EXAMPLE 19 | 0.300 | 0.300 | 1.010 | CuO | 0.30 | SPUTTERING METHOD |
| EXAMPLE 20 | 0.300 | 0.300 | 1.010 | $Cr_2O_3$ | 0.30 | SPUTTERING METHOD |
| EXAMPLE 21 | 0.300 | 0.300 | 1.010 | $Al_2O_3$ | 0.30 | SPUTTERING METHOD |
| EXAMPLE 22 | 0.300 | 0.300 | 1.010 | $Ga_2O_3$ | 0.30 | SPUTTERING METHOD |
| EXAMPLE 23 | 0.300 | 0.300 | 1.010 | $In_2O_3$ | 0.30 | SPUTTERING METHOD |
| EXAMPLE 24 | 0.300 | 0.300 | 1.010 | $V_2O_3$ | 0.30 | SPUTTERING METHOD |
| EXAMPLE 25 | 0.300 | 0.300 | 1.010 | $Y_2O_3$ | 0.30 | SPUTTERING METHOD |
| EXAMPLE 26 | 0.300 | 0.300 | 1.010 | $Dy_2O_3$ | 0.30 | SPUTTERING METHOD |

| | RELATIONSHIP BETWEEN DEGREES OF ORIENTATION | | RELATIVE DIELECTRIC CONSTANT (—) | RESISTANCE (MΩ) | DAMAGE TO DIELECTRIC MEMBRANE | DETERMINATION |
|---|---|---|---|---|---|---|
| | F1>F2 | F3>F2 | | | | |
| EXAMPLE 18 | ✓ | ✗ | 1426 | 90390 | NO DAMAGE | ✓+ |
| EXAMPLE 19 | ✓ | ✓ | 1456 | 28948 | NO DAMAGE | ✓+ |
| EXAMPLE 20 | ✓ | ✗ | 1332 | 70980 | NO DAMAGE | ✓+ |
| EXAMPLE 21 | ✓ | ✓ | 1335 | 28771 | NO DAMAGE | ✓+ |
| EXAMPLE 22 | ✗ | ✓ | 1411 | 64450 | NO DAMAGE | ✓+ |
| EXAMPLE 23 | ✓ | ✗ | 1301 | 46850 | NO DAMAGE | ✓+ |
| EXAMPLE 24 | ✓ | ✓ | 1576 | 100260 | NO DAMAGE | ✓+ |
| EXAMPLE 25 | ✓ | ✓ | 1353 | 20550 | NO DAMAGE | ✓+ |
| EXAMPLE 26 | ✓ | ✗ | 1415 | 14473 | NO DAMAGE | ✓+ |

Fig.6

| | MEMBRANE COMPOSITION $(Ba_{1-x}Ca_x)_z(Ti_{1-y}Zr_y)O_3$ | | | ACCESSORY COMPONENT | WITH RESPECT TO 100 mol OF MAIN COMPONENT (mol) | PRODUCTION METHOD | RELATIONSHIP BETWEEN DEGREES OF ORIENTATION | |
|---|---|---|---|---|---|---|---|---|
| | x | y | z | | | | F1>F2 | F3>F2 |
| EXAMPLE 27 | 0.300 | 0.300 | 1.010 | MnO | 0.30 | SPUTTERING METHOD | ✓ | ✓ |
| EXAMPLE 28 | 0.300 | 0.300 | 1.010 | MnO | 0.30 | SPUTTERING METHOD | × | ✓ |

| | RELATIONSHIP BETWEEN INTEGRATED INTENSITIES (111)>(100) | RELATIVE DIELECTRIC CONSTANT (—) | RESISTANCE (MΩ) | DAMAGE TO DIELECTRIC MEMBRANE | DETERMINATION |
|---|---|---|---|---|---|
| EXAMPLE 27 | ✓ | 2002 | 83310 | NO DAMAGE | ✓+ |
| EXAMPLE 28 | ✓ | 2115 | 77290 | NO DAMAGE | ✓+ |

Fig. 7

| | MEMBRANE COMPOSITION $(Ba_{1-x}Ca_x)_z(Ti_{1-y}Zr_y)O_3$ | | | ACCESSORY COMPONENT | WITH RESPECT TO 100 mol OF MAIN COMPONENT (mol) | PRODUCTION METHOD | RELATIONSHIP BETWEEN DEGREES OF ORIENTATION | |
|---|---|---|---|---|---|---|---|---|
| | x | y | z | | | | F1>F2 | F3>F2 |
| EXAMPLE 29 | 0.300 | 0.300 | 1.010 | MnO | 0.01 | SPUTTERING METHOD | ✓ | ✓ |
| EXAMPLE 30 | 0.300 | 0.300 | 1.010 | MnO | 2.00 | PLD METHOD | ✓ | ✓ |
| EXAMPLE 31 | 0.300 | 0.300 | 1.010 | MnO | 5.00 | SPUTTERING METHOD | ✓ | × |
| EXAMPLE 32 | 0.300 | 0.300 | 1.010 | MnO | 7.00 | SPUTTERING METHOD | × | ✓ |
| EXAMPLE 33 | 0.300 | 0.300 | 1.010 | MnO | 8.00 | SPUTTERING METHOD | ✓ | ✓ |
| EXAMPLE 34 | 0.300 | 0.300 | 1.010 | MnO+Y$_2$O$_3$ | 1.00 | SPUTTERING METHOD | ✓ | ✓ |
| EXAMPLE 35 | 0.300 | 0.300 | 1.010 | CuO+Y$_2$O$_3$+V$_2$O$_5$ | 1.50 | SPUTTERING METHOD | ✓ | × |

| | RELATIVE DIELECTRIC CONSTANT (–) | RESISTANCE (MΩ) | DAMAGE TO DIELECTRIC MEMBRANE | DETERMINATION |
|---|---|---|---|---|
| EXAMPLE 29 | 1533 | 10447 | NO DAMAGE | ✓+ |
| EXAMPLE 30 | 1481 | 68300 | NO DAMAGE | ✓+ |
| EXAMPLE 31 | 1327 | 55110 | NO DAMAGE | ✓+ |
| EXAMPLE 32 | 1166 | 36930 | NO DAMAGE | ✓+ |
| EXAMPLE 33 | 1082 | 6696 | NO DAMAGE | ✓ |
| EXAMPLE 34 | 1376 | 60730 | NO DAMAGE | ✓+ |
| EXAMPLE 35 | 1310 | 87810 | NO DAMAGE | ✓+ |

DIELECTRIC MEMBRANE AND DIELECTRIC ELEMENT

CROSS-REFERENCE TO RELATED APPLICATIONS

This application is based upon and claims the benefit of priority from Japanese Patent Application No. 2018-61459, filed on 28 Mar. 2018, the entirety of the contents of which are incorporated herein by reference.

TECHNICAL FIELD

The present disclosure relates to a dielectric membrane and a dielectric element.

BACKGROUND

In the related art, for example, a metal oxide (general formula: $ABO_3$) having a Perovskite structure such as barium titanate ($BaTiO_3$) has been utilized as a dielectric material for dielectric elements such as thin-film capacitors. A dielectric membrane may be exposed to an acid solution during a wet process such as plating or wet etching after being formed as a membrane to be fabricated as an element. At this time, the dielectric membrane may be damaged by the acid solution.

The following Patent Literature 1 discloses a technology of enhancing the resistance of a dielectric membrane consisting of a metal oxide having a Perovskite structure to a wet process.

[Patent Literature 1] Japanese Unexamined Patent Publication No. 2004-210601

[Patent Literature 2] Japanese Unexamined Patent Publication No. 2011-236112

SUMMARY

The inventors have repeatedly researched resistance of a dielectric membrane consisting of a metal oxide having a Perovskite structure to a wet process and have newly found a technology in which the resistance to a wet process can be further improved.

According to the present disclosure, a dielectric membrane and a dielectric element improved in resistance to a wet process are provided.

According to an embodiment of the present disclosure, there is provided a dielectric membrane including a metal oxide, as a main component, having a cubic crystal structure expressed by a general formula (Ba, Ca)(Ti, Zr)$O_3$. A relationship in a membrane thickness direction of at least one of degree of orientation of (100) plane>degree of orientation of (110) plane and degree of orientation of (111) plane>degree of orientation of (110) plane is satisfied.

The inventors have found that when the main component of a dielectric membrane includes Ca having a lower ionization tendency than Ba and Zr having a lower ionization tendency than Ti and when a membrane density is increased by raising the degree of orientation of at least one of a (100) plane and a (111) plane to be higher than the degree of orientation of a (110) plane, situations in which the dielectric membrane is damaged during a wet process are significantly reduced.

In the dielectric membrane according to the embodiment, the metal oxide included as the main component may be expressed by a general formula $(Ba_{1-x}Ca_x)_z(Ti_{1-y}Zr_y)O_3$ and $0.001 \le x \le 0.500$, $0.001 \le y \le 0.400$, and $0.995 < z < 1.040$ may be satisfied. In this case, a relative dielectric constant and a resistance value are improved.

In the dielectric membrane according to the embodiment, an integrated intensity of a diffraction peak of a (111) plane may be higher than an integrated intensity of a diffraction peak of a (100) plane in an X-ray diffraction chart related to the membrane thickness direction. In this case, the integrated intensity of the diffraction peak of the (111) plane having a high relative dielectric constant is increased. Therefore, the relative dielectric constant is further improved.

The dielectric membrane according to the embodiment may further include at least one selected from the group consisting of Mn, Cu, Cr, Al, Ga, In, V, and a rare earth element as an accessory component. In this case, an abundance ratio of a crystal grain boundary of the accessory component is higher than an abundance ratio inside crystal grains. Therefore, the resistance value of the crystal grain boundary increases. As a result, the resistance value of the dielectric membrane is improved.

In the dielectric membrane according to the embodiment, the accessory component may be included within a range of 0.01 mol to 7.00 mol with respect to 100 mol of the main component.

According to another embodiment of the present disclosure, there is provided a dielectric element including the dielectric membrane described above and an electrode.

BRIEF DESCRIPTION OF THE DRAWINGS

FIG. 2 is a table showing experimental results according to examples of the present disclosure.

FIG. 3 is a table showing experimental results according to examples of the present disclosure.

FIG. 4 is a table showing experimental results according to examples of the present disclosure.

FIG. 5 is a table showing experimental results according to examples of the present disclosure.

FIG. 6 is a table showing experimental results according to examples of the present disclosure.

FIG. 7 is a table showing experimental results according to examples of the present disclosure.

DETAILED DESCRIPTION

Figure 1:
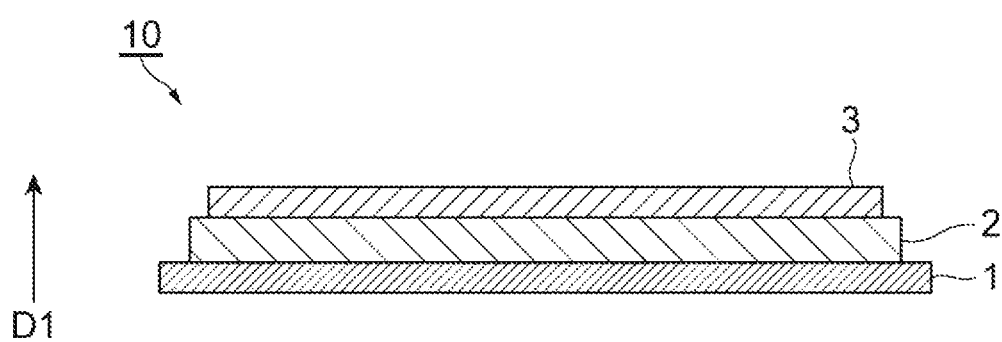
FIG. 1 is a view illustrating a lamination structure of a thin-film capacitor according to an embodiment of the present disclosure.

Hereinafter, an embodiment and various examples will be described with reference to the drawings. In each of the drawings, the same reference signs are applied to parts which are the same or corresponding, and duplicated description thereof will be omitted.

FIG. 1 illustrates a thin-film capacitor 10 as an example of a dielectric element. As illustrated in FIG. 1, the thin-film capacitor 10 has a lamination structure including a lower electrode 1, a dielectric membrane 2, and an upper electrode 3. The thin-film capacitor 10 has a configuration in which the dielectric membrane 2 is interposed between the lower electrode 1 and the upper electrode 3.

Both the lower electrode 1 and the upper electrode 3 are thin-film electrodes. The lower electrode 1 and the upper electrode 3 face each other in a lamination direction D1 of the thin-film capacitor 10. For example, the lower electrode 1 and the upper electrode 3 can be constituted of a metal material such as Ni or Cu. In the present embodiment, the lower electrode 1 is a non-orientation Ni foil, and the upper electrode 3 is a Cu membrane.

The dielectric membrane 2 is a thin membrane which includes, as a main component, a metal oxide having a cubic crystal structure (Perovskite structure) expressed by a general formula (Ba, Ca)(Ti, Zr)$O_3$ (which may hereinafter be referred to as BCTZ). When the composition of the main component BCTZ of the dielectric membrane 2 is expressed as $(Ba_{1-x}Ca_x)(Ti_{1-y}Zr_y)O_3$, it is possible to design a dielectric membrane satisfying $0.001 \leq x \leq 0.500$, $0.001 \leq y \leq 0.400$, and $0.995 < z < 1.040$. The dielectric membrane 2 can include, as an accessory component, at least one selected from the group consisting of Mn, Cu, Cr, Al, Ga, In, V and a rare earth element. The dielectric membrane 2 may include the accessory component within a range of 0.01 mol to 7.00 mol with respect to 100 mol of the main component. The thickness of the dielectric membrane 2 may be within a range of 40 to 2,000 nm. As an example, the thickness of the dielectric membrane 2 is 600 nm.

The dielectric membrane 2 is an oriented growth thin membrane (so-called oriented membrane), and the degree of orientation is adjustable. Specifically, when the degree of orientation of a (100) plane is F1, the degree of orientation of a (110) plane is F2, and the degree of orientation of a (111) plane is F3 with respect to a membrane thickness direction of the dielectric membrane 2 (that is, the lamination direction D1 of the thin-film capacitor 10), the degrees of orientation are adjusted such that at least one of F1>F2 and F3>F2 is satisfied. In the present embodiment, the dielectric membrane 2 satisfies both F1>F2 and F3>F2.

The degree of orientation of each of the (100) plane, the (110) plane, and the (111) plane was obtained from an X-ray diffraction pattern. That is, the degree F. of orientation of an (hkl) plane was obtained based on the ratio of the integrated intensity of diffraction from the (hkl) plane to (the integrated intensity of diffraction from the (100) plane, the integrated intensity of diffraction from the (110) plane, and the integrated intensity of diffraction from the (111) plane). Hereinafter, Fp indicates the degree of orientation of a powder sample, and Ff indicates the degree of orientation of a thin membrane sample. The (hid) plane having the degree Fp of orientation with respect to a non-orientation BCTZ powder sample was Fp(100) plane/Fp(110) plane=0.12 and Fp(111) plane/Fp(110) plane=0.17. Therefore, when the degree of orientation of a dielectric membrane became Ff(100)/Ff (110)>0.12 and Ff(111)/Ff(110)>0.17, it is determined that there was preferential orientation of a crystal plane. The integrated intensity was calculated by using synthetic powder X-ray analysis software PDXL (manufactured by Rigaku Corporation).

The degree of orientation of the dielectric membrane 2 can be adjusted in accordance with conditions of membrane formation. For example, when the dielectric membrane 2 is formed as a membrane using a sputtering method, the degree of orientation of the dielectric membrane 2 can be adjusted by changing the conditions of sputtering, such as the type of gas, the pressure, or the membrane formation temperature.

In the dielectric membrane 2 in an X-ray diffraction chart related to the membrane thickness direction, the integrated intensity of the diffraction peak of the (111) plane is higher than the integrated intensity of the diffraction peak of the (100) plane.

The dielectric membrane 2 described above may be exposed to an acid solution such as hydrochloric acid, nitric acid, or sulfuric acid during a wet process after membrane formation (for example, a step of element fabrication). For example, the dielectric membrane 2 may be immersed in an acid solution having a concentration within a range of 0.1 mol/L to 10 mol/L for a period within a range of 10 seconds to 1 hour. The inventors have newly found that when the dielectric membrane 2 includes Ca having a lower ionization tendency than Ba and Zr having a lower ionization tendency than Ti in the main component BCTZ and when the membrane density is increased by at least one of F1>F2 and F3>F2 being satisfied, situations in which Ba or Ti in BCTZ is eluted due to an acid solution are significantly reduced. As a result, the dielectric membrane 2 is less likely to be damaged during a wet process, and improvement in resistance to a wet process is realized.

When the composition $(Ba_{1-x}Ca_x)_z(Ti_{1-y}Zr_y)O_3$ of the main component BCTZ of the dielectric membrane 2 satisfies $0.001<x<0.500$, $0.001<y<0.400$, and $0.995<z<1.040$, the relative dielectric constant and the resistance value are improved.

Moreover, in the X-ray diffraction chart related to the membrane thickness direction of the dielectric membrane 2, when the integrated intensity of the diffraction peak of the (111) plane is higher than the integrated intensity of the diffraction peak of the (100) plane, the relative dielectric constant of the dielectric membrane 2 is further improved.

When the dielectric membrane 2 includes, as an accessory component, at least one selected from the group consisting of Mn, Cu, Cr, Al, Ga, In, V, and a rare earth element, the abundance ratio of a crystal grain boundary of the accessory component is higher than the abundance ratio inside crystal grains. Therefore, the resistance value of the crystal grain boundary increases. As a result, the resistance value of the dielectric membrane 2 is improved.

EXAMPLES

Hereinafter, the details and the results of experiments performed by the inventors will be described with reference to the tables in FIGS. 2 to 7.

In order to confirm the relationship between the degree of orientation of (Ba, Ca)(Ti, Zr)$O_3$ and the resistance to a wet process, the inventors prepared a plurality of samples having dielectric membranes different from each other in the membrane composition and the degree of orientation of the (100) plane, the (110) plane, and the (111) plane and determined the resistance to a wet process of each of the samples. The determination of the resistance to a wet process was confirmed after a dielectric membrane was immersed in an acid solution, by observing damage to the dielectric membrane 2 in a region of 200 μm×200 μm using an optical microscope and observing a region of 20 μm×200 μm using an SEM. More specifically, cracking and membrane peeling were observed in 10 observation regions using the optical microscope and the SEM. For samples in which no damage was observed at all, they were indicated with "no damage". For samples in which one or more spots of damage were observed, they were indicated with "damaged".

The table of FIG. 2 shows the results. All of the samples according to Examples 1 to 7 and the Comparative Examples 1 to 3 shown in the table of FIG. 2 were formed as membranes by a sputtering method.

The samples according to Examples 1 to 3 had the same composition $(Ba_{1-x}Ca_x)(Ti_{1-y}Zr_y)O_3$ of the main component BCTZ (that is, x=0.300, y=0.300, and Z=1.010) and differed from each other in only the relationship between the degrees of orientation. Regarding the degree of orientation, the sample according to Example 1 satisfied only the relationship F1>F2, the sample according to Example 2 satisfied only the relationship F3>F2, and the sample according to Example 3 satisfied both the relationships F1>F2 and F3>F2. As the results of determination of the resistance to a wet process in the samples according to Examples 1 to 3, all of the samples according to Examples 1 to 3 were indicated with "no damage".

The samples according to Examples 4 to 7 differed from each other in the composition of the main component BCTZ. Regarding the degree of orientation, the sample according to Example 4 satisfied only the relationship F1>F2, both the samples according to Examples 5 and 6 satisfied only the relationship F3>F2, and the sample according to Example 7 satisfied both the relationships F1>F2 and F3>F2. As the results of determination of the resistance to a wet process in the samples according to Examples 4 to 7, all of the samples according to Examples 4 to 7 were indicated with "no damage".

The sample according to the Comparative Example 1 was constituted of a metal oxide (that is, a metal oxide expressed by (Ba, Ca)TiO$_3$) including no Zr. The sample according to the Comparative Example 2 was constituted of a metal oxide (that is, a metal oxide expressed by Ba(Ti, Zr)O$_3$) including no Ca. As the results of determination of the resistance to a wet process in the samples according to the Comparative Examples 1 and 2, both the samples according to the Comparative Examples 1 and 2 were indicated with "damaged".

The sample according to the Comparative Example 3 had the same composition of the main component BCTZ as the sample according to Example 1 and differed from Example 1 in the relationship between the degrees of orientation. That is, the sample according to the Comparative Example 3 satisfied neither of the relationships F1>F2 and F3>F2. As the result of determination of the resistance to a wet process in the sample according to the Comparative Example 3, it was indicated with "damaged".

From the results described above, when at least one of F1>F2 and F3>F2 was satisfied in the dielectric membranes including BCTZ as a main component, it was confirmed that the resistance to a wet process was improved.

In order to confirm the relationship between the composition and the relative dielectric constant and the resistance value of dielectric layers, the inventors prepared a plurality of samples having different membrane compositions and determined the relative dielectric constant and the resistance value (MΩ) of each of the samples. In determination of the relative dielectric constant, the relative dielectric constant of 1,000 was adopted as a standard. In determination of the resistance value, 100 MΩ was adopted as a standard.

The table of FIG. 3 shows the results. In the table of FIG. 3, the determination of the samples in which both the relative dielectric constant and the resistance value exceeded the foregoing standards was indicated with "✓". All of the samples according to Examples 8 to 13 and the Comparative Examples 4 to 7 shown in the table of FIG. 3 were formed as membranes by a sputtering method.

Regarding the composition of the main component BCTZ in the dielectric layer, the samples according to Examples 8 and 9 satisfied all of 0.001≤x≤0.500, 0.001≤y≤0.400, and 0.995<z<1.040. However, in the sample according to the Comparative Example 4, z was 0.995, which was beyond the lower limit of 0.995<z<1.040.

Regarding the composition of the main component BCTZ in the dielectric layer, the samples according to Examples 10 and 11 satisfied all of 0.001≤x≤0.500, 0.001≤y≤0.400, and 0.995<z<1.040. However, in the sample according to the Comparative Example 5, z was 1.040, which was beyond the upper limit of 0.995<z<1.040.

Regarding the composition of the main component BCTZ in the dielectric layer, the samples according to Examples 12 and 13 satisfied all of 0.001≤x≤0.500, 0.001≤y≤0.400, and 0.995<z<1.040. However, in the sample according to the Comparative Example 6, x was 0.550, which was beyond the upper limit of 0.001≤x≤0.500. In the sample according to the Comparative Example 7, y was 0.500, which was beyond the upper limit of 0.001≤y≤0.400.

From the results described above, it was confirmed that when all of 0.001≤x≤0.500, 0.001≤y≤0.400, and 0.995<z<1.040 were satisfied regarding the composition of the main component $(Ba_{1-x}Ca_x)_z(Ti_{1-y}Zr_y)O_3$ in the dielectric layer, the relative dielectric constant and the resistance value were improved.

All of the samples according to Examples 8 to 13 and the Comparative Examples 4 to 7 shown in the table of FIG. 3 included BCTZ as a main component and satisfied at least one of F1>F2 and F3>F2. Therefore, the determination of the resistance to a wet process was indicated with "no damage", and the resistance to a wet process was improved in all of the samples according to Examples 8 to 13 and the Comparative Examples 4 to 7.

Moreover, in order to confirm the relationship between the integrated intensity of the diffraction peak and the relative dielectric constant in the X-ray diffraction chart related to the membrane thickness direction, the inventors prepared a plurality of samples having different degrees of orientation and determined the relative dielectric constant of each of the samples. In determination of the relative dielectric constant, the relative dielectric constant of 2,000 was adopted as a standard.

The table of FIG. 4 shows the results. In the table of FIG. 4, the determination of the samples in which the relative dielectric constant exceeded the foregoing standards was indicated with "✓+". All of the samples according to Examples 14 to 17 shown in the table of FIG. 4 were formed as membranes by a sputtering method.

Both the samples according to Examples 14 and 15 had the same composition $(Ba_{1-x}Ca_x)_z(Ti_{1-y}Zr_y)O_3$ of the main component BCTZ (that is, x=0.300, y=0.300, and Z=1.010) while having the integrated intensity of the diffraction peak of the (111) plane higher than the integrated intensity of the diffraction peak of the (100) plane and differed from each other in only the relationship between the degrees of orientation. Regarding the degree of orientation, the sample according to Example 14 satisfied both the relationships F1>F2 and F3>F2, and the sample according to Example 15 satisfied only the relationship F3>F2. In both the samples according to Examples 14 and 15, an extremely high relative dielectric constant exceeding the foregoing standards could be obtained.

Both the samples according to Examples 16 and 17 had the same composition $(Ba_{1-x}Ca_x)_z(Ti_{1-y}Zr_y)O_3$ of the main component BCTZ (that is, x=0.300, y=0.300, and Z=1.010) while having the integrated intensity of the diffraction peak of the (111) plane not higher than the integrated intensity of the diffraction peak of the (100) plane and differed from each other in only the relationship between the degrees of orientation. Regarding the degree of orientation, the sample according to Example 16 satisfied both the relationships F1>F2 and F3>F2, and the sample according to Example 17 satisfied only the relationship F1>F2. In both the samples according to Examples 16 and 17, although the foregoing standards were not exceeded, a high relative dielectric constant could be obtained.

From the results described above, it was confirmed that when the integrated intensity of the diffraction peak of the (111) plane was higher than the integrated intensity of the diffraction peak of the (100) plane in the X-ray diffraction chart related to the membrane thickness direction, the relative dielectric constant of the dielectric membrane was further improved.

All of the samples according to Examples 14 to 17 shown in the table of FIG. 4 included BCTZ as a main component and satisfied at least one of F l>F2 and F3>F2. Therefore, the determination of the resistance to a wet process was indicated with "no damage", and the resistance to a wet process was improved in all of the samples according to Examples 14 to 17.

In order to confirm the relationship between the accessory component and the resistance value of the dielectric membrane, the inventors prepared a plurality of samples having different accessory components and determined the resistance value (MΩ) of each of the samples. In determination of the resistance value, the resistance value of 10,000 MΩ was adopted as a standard.

The table of FIG. 5 shows the results. In the table of FIG. 5, the determination of the samples in which the resistance value exceeded the foregoing standards was indicated with "✓+". All of the samples according to Examples 18 to 26 shown in the table of FIG. 5 were formed as membranes by a sputtering method.

The samples according to Examples 18 to 26 respectively included MnO, CuO, $Cr_2O_3$, $Al_2O_3$, $Ga_2O_3$, $In_2O_3$, $In_2O_3$, $V_2O_3$, $Y_2O_3$, and $Dy_2O_3$, as an accessory component. All of the samples according to Examples 18 to 26 included 0.30 mol of the corresponding accessory component with respect to 100 mol of the main component.

The resistance value of each of the samples according to Examples 18 to 26 was obtained. As a result, a high resistance value could be obtained in all of Examples 18 to 26.

From the results described above, it was confirmed that when a dielectric membrane included BCTZ as a main component and included at least one of the foregoing accessory components (Mn, Cu, Cr, Al, Ga, In, V and a rare earth element), the resistance value of the dielectric membrane was improved compared to when having it included no accessory component (for example, Examples 1 to 17).

All of the samples according to Examples 18 to 26 shown in the table of FIG. 5 included BCTZ as a main component and satisfied at least one of F1>F2 and F3>F2. Therefore, the determination of the resistance to a wet process was indicated with "no damage", and the resistance to a wet process was improved in all of the samples according to Examples 18 to 26.

Moreover, the inventors also confirmed the case in which a dielectric membrane includes an accessory component and the integrated intensity of the diffraction peak of the (111) plane was higher than the integrated intensity of the diffraction peak of the (100) plane in the X-ray diffraction chart related to the membrane thickness direction. The table of FIG. 6 shows the results.

Both the samples according to Examples 27 and 28 shown in the table of FIG. 6 included MnO as an accessory component. Both the samples according to Examples 27 and 28 included 0.30 mol of MnO as an accessory component with respect to 100 mol of the main component.

The resistance value and the relative dielectric constant of each of the samples according to Examples 27 and 28 were obtained. As a result, a high resistance value and a high relative dielectric constant could be obtained in both samples according to Examples 27 and 28.

From the results described above, it was confirmed that even when a dielectric membrane included the foregoing accessory component and the integrated intensity of the diffraction peak of the (111) plane was higher than the integrated intensity of the diffraction peak of the (100) plane in the X-ray diffraction chart related to the membrane thickness direction, the relative dielectric constant of the dielectric membrane was improved.

In order to confirm the relationship between the ratio of the accessory component included in the dielectric membrane and the resistance value, the inventors prepared a plurality of samples having accessory components different from each other in the containing ratio and determined the resistance value of each of the samples. In determination of the resistance value, the resistance value of 10,000 MΩ was adopted as a standard.

The table of FIG. 7 shows the results. In the table of FIG. 7, the determination of the samples in which the resistance value exceeded the foregoing standards was indicated with "✓+". Only the sample according to Example 30 of the samples according to Examples 29 to 35 shown in the table of FIG. 7 was formed as a membrane by a pulsed laser deposition method (PLD method), and the remaining samples were formed as membranes by a sputtering method.

In the samples according to Examples 29 to 33, the amounts of MnO to be included as an accessory component with respect to 100 mol of the main component were set to 0.01 mol, 2.00 mol, 5.00 mol, 7.00 mol, and 8.00 mol, respectively. In the sample according to Example 34, the amounts of MnO and $Y_2O_3$ to be included as accessory components with respect to 100 mol of the main component were set to 1.00 mol. Moreover, in the sample according to Example 35, the amounts of CuO, $Y_2O_3$, and $V_2O_5$ to be included as accessory components with respect to 100 mol of the main component were set to 1.50 mol.

The resistance value of each of the samples according to Examples 29 to 35 was obtained. As a result, a high resistance value was obtained in all of the samples according to Examples 29 to 35. Particularly, an extremely high resistance value could be obtained in the samples according to Examples 29 to 32, 34, and 35.

From the results described above, it was confirmed that when a dielectric membrane included BCTZ as a main component and included the foregoing accessory components within a range of 0.01 mol to 7.00 mol with respect to 100 mol of the main component, the resistance value of the dielectric membrane was further improved.

All of the samples according to Examples 29 to 35 shown in the table of FIG. 7 included BCTZ as a main component and satisfied at least one of F1>F2 and F3>F2. Therefore, the determination of the resistance to a wet process was indicated with "no damage", and the resistance to a wet process was improved in all of the samples according to Examples 29 to 35.

Hereinabove, the embodiment of the present disclosure has been described. However, the present disclosure is not limited to the foregoing embodiment, and various changes can be made. For example, the dielectric element is not limited to the thin-film capacitors described above, and an electrostatic capacitance thin-film sensor or the like may be adopted.

What is claimed is:

1. A dielectric membrane comprising:
   a metal oxide, as a main component, having a cubic crystal structure expressed by a general formula (Ba, Ca)(Ti, Zr)$O_3$,
   wherein a relationship in a membrane thickness direction of both degree of orientation of (100) plane>degree of orientation of (110) plane and degree of orientation of (111) plane>degree of orientation of (110) plane is satisfied.

2. The dielectric membrane according to claim 1, wherein the metal oxide included as the main component is expressed by a general formula $(Ba_{1-x}Ca_x)_z(Ti_{1-y}Zr_y)O_3$ and $0.001 \leq x \leq 0.500$, $0.001 \leq y \leq 0.400$, and $0.995 < z < 1.040$ are satisfied.

3. The dielectric membrane according to claim 1, wherein an integrated intensity of a diffraction peak of a (111) plane is higher than an integrated intensity of a diffraction peak of a (100) plane in an X-ray diffraction chart related to the membrane thickness direction.

4. The dielectric membrane according to claim 1, further comprising, at least one selected from the group consisting of Mn, Cu, Cr, Al, Ga, In, V, and a rare earth element as an accessory component.

5. The dielectric membrane according to claim 4, wherein the accessory component is included within a range of 0.01 mol to 7.00 mol with respect to 100 mol of the main component.

6. A dielectric element comprising:
   the dielectric membrane according to claim 1; and
   an electrode.

* * * * *